United States Patent [19]
Nakasugi et al.

[11] Patent Number: 5,933,211
[45] Date of Patent: Aug. 3, 1999

[54] CHARGED BEAM LITHOGRAPHY APPARATUS AND METHOD THEREOF

[75] Inventors: Tetsuro Nakasugi; Yumi Watanabe, both of Yokohama, Japan

[73] Assignee: Kabushiki Kaisha Toshiba, Kawasaki, Japan

[21] Appl. No.: 08/917,212

[22] Filed: Aug. 25, 1997

[30] Foreign Application Priority Data

Aug. 26, 1996 [JP] Japan .................................. 8-223386

[51] Int. Cl.$^6$ .......................... G03B 27/00; G01N 23/00
[52] U.S. Cl. ............................................ 355/18; 250/310
[58] Field of Search .................................. 355/18, 53, 67, 355/77; 250/492.2, 492.22, 492.23, 310, 491.1; 430/5, 30

[56] References Cited

U.S. PATENT DOCUMENTS

| | | | |
|---|---|---|---|
| 4,673,918 | 6/1987 | Adler et al. | 340/365 P |
| 5,134,298 | 7/1992 | Inagaki et al. | 250/491.1 |
| 5,155,355 | 10/1992 | Kabaya | 250/237 G |
| 5,256,881 | 10/1993 | Yamazaki et al. | 250/492.23 |
| 5,369,282 | 11/1994 | Arai et al. | 250/492.22 |
| 5,373,163 | 12/1994 | Sigg | 250/370.01 |
| 5,430,292 | 7/1995 | Honjo et al. | 250/310 |
| 5,523,576 | 6/1996 | Koide et al. | 250/491.1 |
| 5,557,110 | 9/1996 | Itoh | 250/492.23 |

FOREIGN PATENT DOCUMENTS

8-191042  7/1996  Japan .

OTHER PUBLICATIONS

T.H.P. Chang, et al., "Arrayed Miniature Electron Beam Columns for High Throughput Sub–100nm Lithography", J. Vac. Sci. Technol. B., vol. 10, No. 6, Nov./Dec. 1992 pp. 2743–2748.

N. Shimazu, et al., "An Approach to a High–Throughput E–Beam Writer with a Single–Gun Multiple–Path System", JPN. J. Appl. Phys., vol. 34, No. 12B, Dec. 1995, pp. 6689–6695.

*Primary Examiner*—Safet Metjahic
*Assistant Examiner*—Henry Hung Nguyen
*Attorney, Agent, or Firm*—Oblon, Spivak, McClelland, Maier & Neustadt, P.C.

[57] ABSTRACT

A charged beam lithography apparatus simultaneously uses multiple charged beams to irradiate a workpiece. In specific embodiments, collimators are employed to assist in aligning the multiple charged beams by eliminating "noise" from reflections of other beams. Each collimator is positioned to correspond with respective of the charged beams and detectors for detecting reflected particles from the charged beams. The particles are reflected from particular marks used in the alignment process. Each collimator helps to prevent particles from adjacent charged beams from entering a detector that corresponds with a specific charged beam.

11 Claims, 15 Drawing Sheets

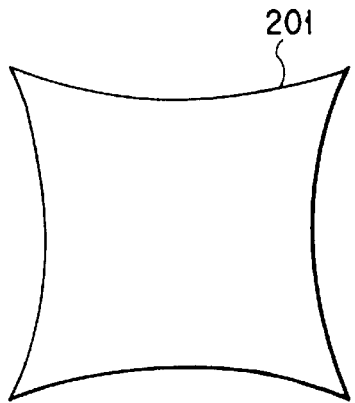
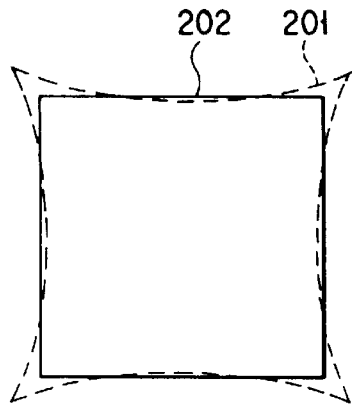
F I G. 1A (PRIOR ART)  F I G. 1B (PRIOR ART)
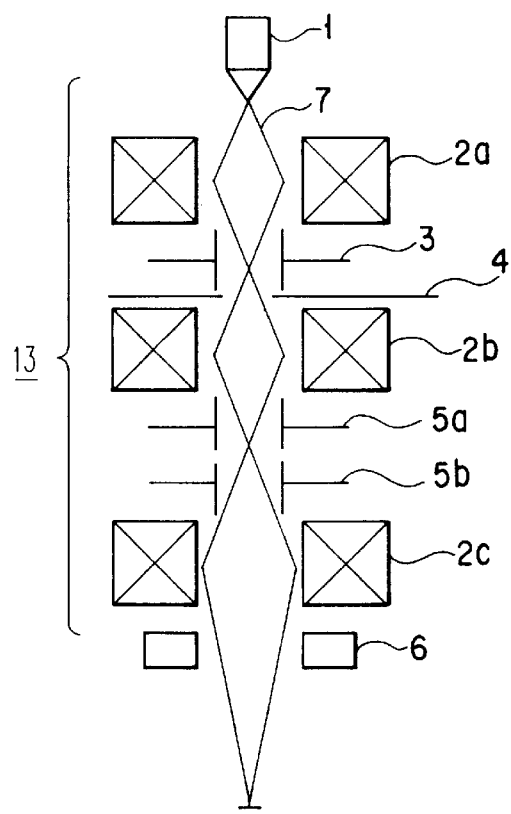
F I G. 2 (PRIOR ART)
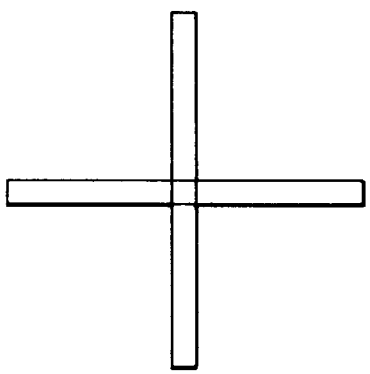
F I G. 3A (PRIOR ART)
F I G. 3B (PRIOR ART)

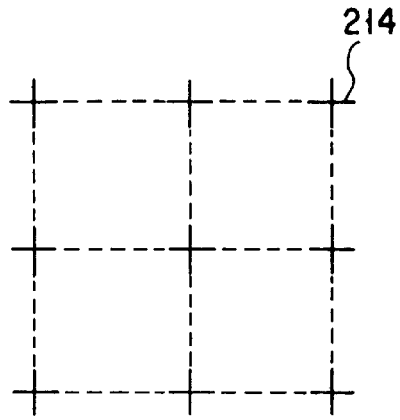
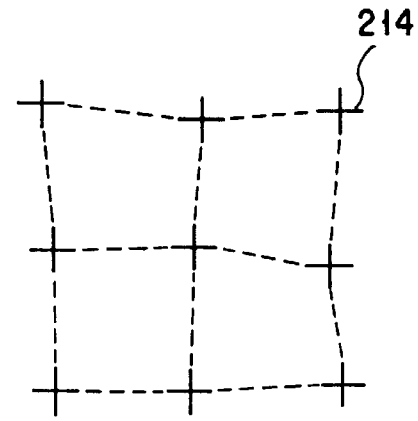
F I G. 7A (PRIOR ART)   F I G. 7B (PRIOR ART)
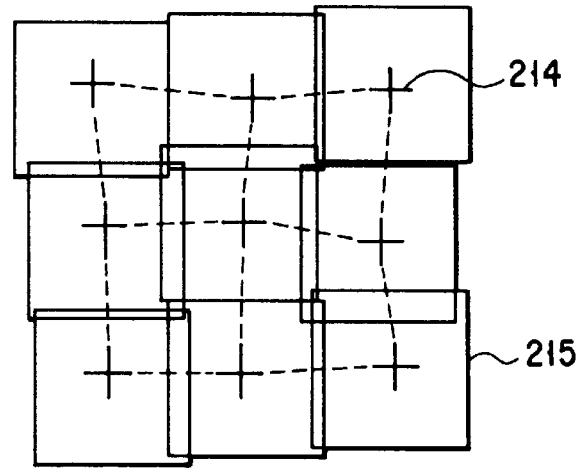
F I G. 8 (PRIOR ART)
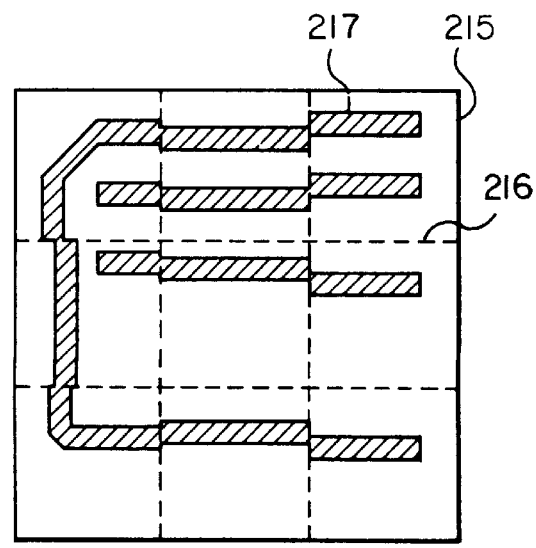
F I G. 9 (PRIOR ART)

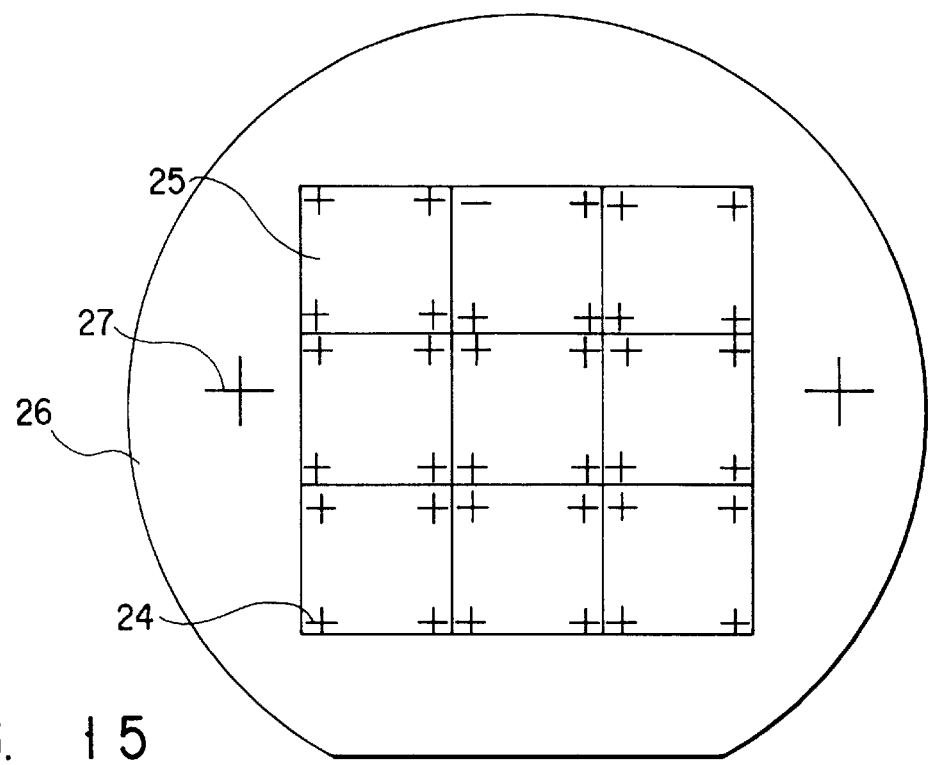
F I G. 15
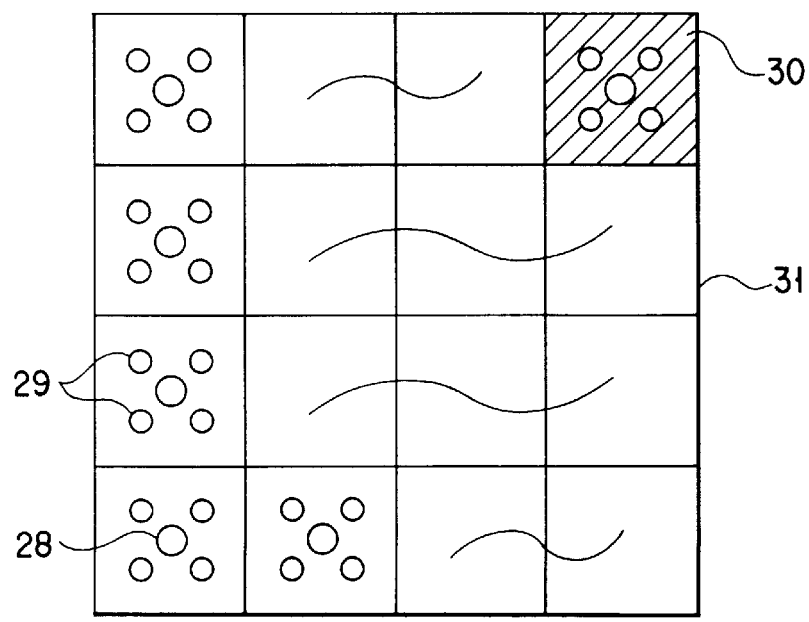
F I G. 16

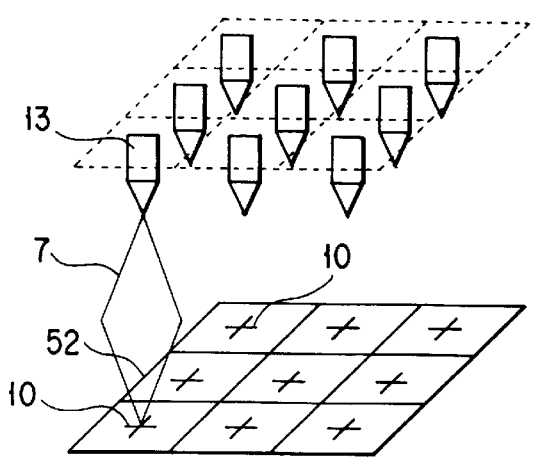
F I G. 22
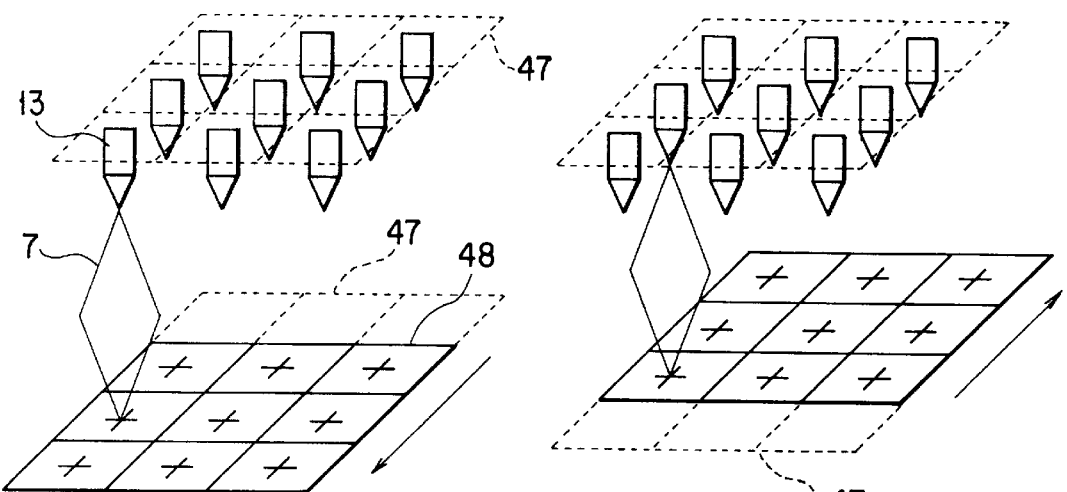
F I G. 23A    F I G. 23B
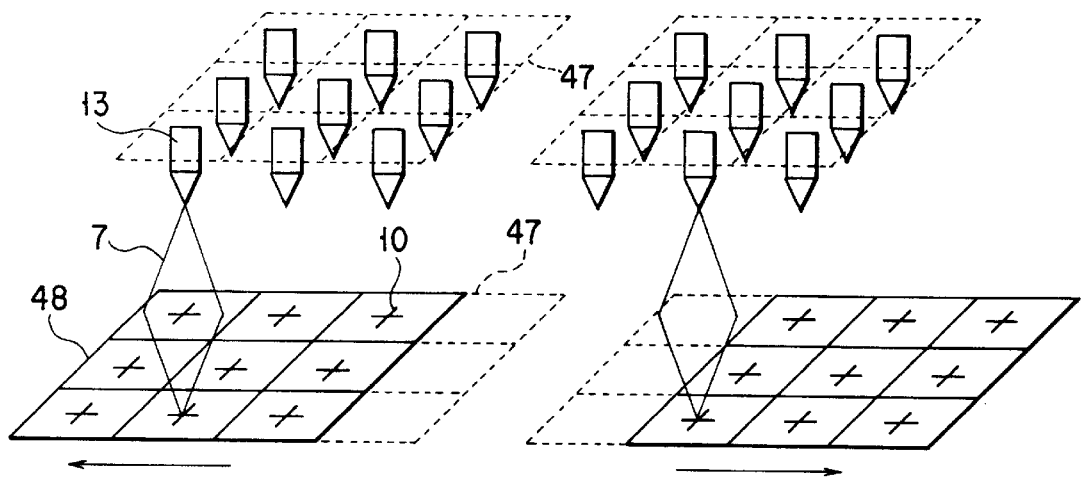
F I G. 24A    F I G. 24B

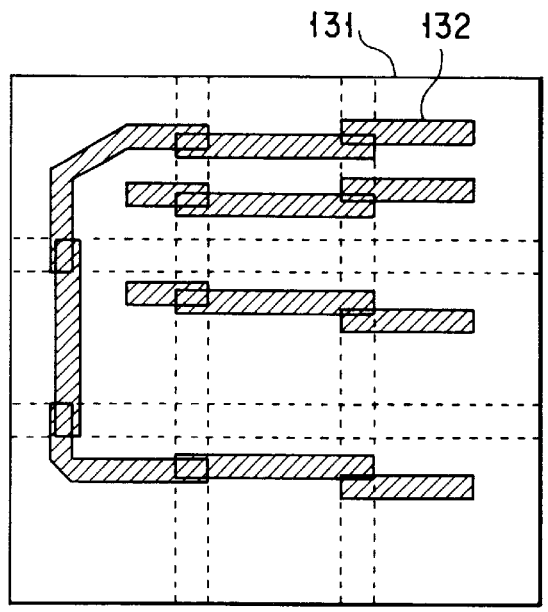
FIG. 27
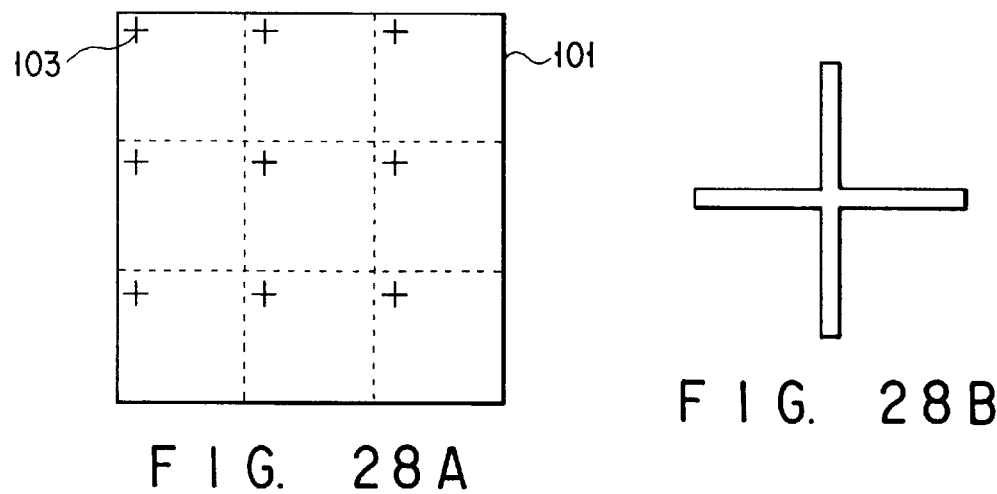
FIG. 28A
FIG. 28B
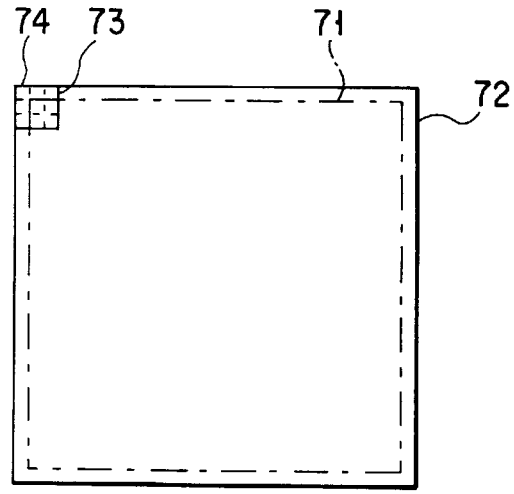
FIG. 29

CHARGED BEAM LITHOGRAPHY APPARATUS AND METHOD THEREOF

BACKGROUND OF THE INVENTION

The present invention relates to an apparatus of multi-beam type having a plurality of charged beam optical systems and a method of charged beam lithography using such a charged beam lithography apparatus.

An electron beam lithography apparatus has conventionally been used widely for developing advanced devices. The conventional electron beam lithography apparatus is such that an electron beam is electromagnetically or electrostatically deflected to draw a desired figure on a workpiece. In the case where the electron beam is simply deflected, however, a deflection distortion occurs as shown in FIG. 1A. It is, therefore, necessary to adjust the drawing position before the drawing operation as shown in FIG. 1B.

The drawing position is adjusted generally in the manner described below.

A stage is moved by the distance of beam deflection and a voltage or a current applied to a deflection electrode or a coil is determined in such a manner that a mark formed on the stage is detectable. In the process, some marks used for beam adjustment take advantage of the difference in the atomic number between each mark and the substrate or in the electron reflection rate due to the unevenness. The size of the beam deflection area is normally several hundred μm to several mm. Before drawing in a range beyond the deflection area, the stage is moved into the beam deflection area.

In FIGS. 1A and 1B, reference numeral 201 designates a deflection area having a distortion, and reference numeral 202 a deflection area of which the distortion is corrected.

In fabricating a semiconductor device, on the other hand, it is a common practice to the base pattern formed on the same substrate is subjected to overlapped exposures. In such a case, the positions of the marks formed on the substrate are required to be detected. Some position-detecting marks take advantage of the difference in the electron reflection rate due to the unevenness of the marks or due to the difference in atomic number between each mark and the substrate. These marks are scanned by an electron beam and the intensity of the reflected electron signals is measured thereby to detect the mark positions.

A technical development is under way for a variety of electron beam lithography apparatuses aimed at a high throughput. Among them, an apparatus of multi-beam type having a plurality of electron beam optical systems is most promising. An electron beam lithography apparatus of multi-beam type, in which a plurality of beams, not a single beam, are used for drawing, is expected to exhibit a remarkably improved drawing throughput.

The apparatus of multi-beam type requires beam adjustment in each optical system. Sequential adjustment of each beam consumes a very long time. For this reason, in the above-mentioned adjustment of the drawing position or the overlapped exposure, the marks are required to be detected simultaneously for a plurality of beams. The simultaneous mark detection using a plurality of beams, however, poses the problem that an accurate positioning is adversely affected by the electrons reflected from other marks.

Specifically, a given electron optical system, as shown in FIG. 2, includes an electron gun 1, beam blanking systems 3, 4, beam deflection systems 5a, 5b, beam adjusting lens systems 2a, 2b, 2c and a reflected electron detector 6. FIGS. 3A and 3b show a general view of a beam-adjusting mark. FIG. 3A is a plan view, and FIG. 3b is a sectional view. In detecting a mark position, as shown in FIG. 4, a mark 10 is formed in a drawing area 12 corresponding to each electron beam optical system 13. A plurality of marks 10 are scanned by a plurality of beams at the same time, and each mark position is detected from the beam scanning position and a corresponding reflected electron signal. In the conventional electron beam optical system, as shown in FIG. 5, the simultaneous mark detection using a plurality of electron beams 7 makes it difficult to detect individual mark positions by reason of the fact that the reflected electrons 9 from other marks intrude the detector 6 sideway together with the reflected electrons 8 from the intended mark.

In a protective measure proposed, the timing of position detection is differentiated for different electron beam optical systems, or the positioning operation is performed not for each chip but for a plurality of chips at a time. These methods, however, pose the problem that the apparatus configuration is complicated and that the mark detection consumes a longer time than when the marks are detected all the electron beam optical systems at the same time.

The multi-beam type of the electron beam lithography apparatus, in which exposure is not collective unlike in the optical stepper or the X-ray exposure, requires beam adjustment for each lens barrel. In the conventional electron beam lithography apparatus having only one electron beam source, only one mark is used for drawing position adjustment. In the multi-beam lithography apparatus requiring many beam adjustments, however, a long time is consumed for beam adjustment when a mark is shared. With the multi-beam lithography apparatus, therefore, a method is required to be employed, in which a reference mark associated with each electron beam optical system is provided and the beam is adjusted for each lens barrel.

The above-mentioned method of adjusting the beam for each lens barrel according to a reference mark corresponding to each electron beam optical system, however, gives rise to the problem described below. Specifically, the chip size is varied with device types, and therefore it is not always the case that each chip corresponds to an electron beam source. As shown in FIG. 6, in the case of drawing a pattern 213 larger than the pitch at which the electron beam optical systems 211 are arranged (more specifically, a drawing area 212 for a given electron beam optical system), the single pattern 213 is drawn using a plurality of electron beam optical systems 211. In the case where electron beam optical systems are arranged at pitches of 10 mm, for example, four or more electron beam optical systems are required for drawing if the chip size is more than 20 mm square. In the case where a workpiece with each side thereof longer than 150 mm such as a photomask is drawn, on the other hand, even more electron beams are used for drawing.

There is no problem encountered in the case where the position of the reference marks 214 of the electron beam optical systems are arranged ideally as shown in FIG. 7A. Actually, however, as shown in FIG. 7B, the arrangement of reference marks should be irregular, so that a pattern drawn on the basis of these reference marks is distorted as shown in FIG. 8. In the case where a given chip is drawn by a plurality of electron beam sources, as shown in FIG. 9, the problem is a deteriorated connection accuracy in the boundaries of the drawing areas of adjacent electron beam optical systems. In FIG. 9, reference numeral 215 designates a drawing area, reference numeral 216 designates a drawing area boundary, and reference numeral 217 designates a drawing pattern.

From the viewpoint of drawing accuracy, the connection accuracy of the defection areas is important. No matter how small the minimum size of a beam, a figure conforming with the design data cannot be drawn on the workpiece if the connection accuracy is low.

As described above, the lithography apparatus of multi-beam type, which uses no collective exposure unlike in the stepper, requires beam adjustment for each lens barrel. Each electron beam source of the multi-beam lithography apparatus has an independent electron beam optical system. Even when the beam is adjusted for each optical system, therefore, the connection accuracy is deteriorated between different electron beams. In addition, the chip size is varied with device types, and it is not always rational to assure correspondence of one chip to one electron beam source. One chip is naturally drawn by a plurality of electron beam sources. The problem posed in the process is a deteriorated connection accuracy in the beam deflection boundary area due to different beam characteristics between different electron beam sources.

In this way, in the conventional electron beam lithography apparatus of multi-beam type, a complicated apparatus configuration is required for mark position detection and a very long time is consumed. Further, when drawing a pattern requiring a drawing area larger than the pitch at which the electron beam optical systems are arranged, the drawing pattern is distorted or the connection accuracy in the drawing areas of adjacent electron beams is deteriorated.

These problems are not confined to the electron beam lithography apparatus, but the same can be said of an ion beam lithography apparatus using an ion beam as a charged beam.

BRIEF SUMMARY OF THE INVENTION

An object of the present invention is to provide a charged beam lithography apparatus and a charged beam lithography method of multi-beam type capable of mark position detection with high accuracy and capable of improving the drawing throughput and the drawing accuracy.

Another object of the present invention is to provide a charged beam lithography apparatus and a charged beam lithography method capable of eliminating the disconnection at the drawing area boundary and thus improving the drawing accuracy.

In order to solve the above-mentioned problem, the apparatus according to the present invention has the following configuration:

(1) A charged beam lithography apparatus of multi-beam type comprises a plurality of charged beam optical systems and a plurality of collimators arranged at positions corresponding to the plurality of charged beam optical systems, respectively. Corresponding method using the above apparatus comprises the step of detecting mark positions at the plurality of charged beam optical systems at the same time.

The plurality of collimators correspond to a plurality of reflected particle detectors of the plurality of charged beam optical systems, respectively. Each of the plurality of collimators is arranged in such a position as to surround the corresponding one of the electron beam optical systems, respectively. The plurality of collimators each include a shielding plate having an aperture of a predetermined shape.

In each charged beam optical system, the reflected particles from other marks are prevented from being detected by a reflected particle detector. As a result, even in the case where the positioning operation is effected in a plurality of the charged beam optical systems at the same time, the mark position can be detected in each charged beam optical system independently, and thereby the drawing throughput and the drawing accuracy can be improved.

(2) A charged beam lithography apparatus of multi-beam type having a plurality of charged beam optical systems, comprises: means for selecting one of the plurality of charged beam optical systems; means for detecting marks sequentially in the charged beam optical systems other than the one selected by the selection means; means for measuring the interference of reflected particles from the other marks in the selected charged beam optical system; means for forming groups each including a plurality of interference-free charged beam optical systems based on the measurement of the measuring means; and means for detecting mark positions at the same time in the charged beam optical systems included in each group formed by the grouping means. A charged beam lithography method using a charged beam lithography apparatus having a plurality of charged beam optical systems, comprises the steps of: selecting one of the plurality of charged beam optical systems; detecting marks sequentially in other charged beam optical systems with the selected charged beam optical system turned off; measuring the interference of reflected electrons from the other marks in the selected charged beam optical system; grouping the interference-free charged beam optical beams based on the result of the measurement; and detecting mark positions at the same time by the charged beams of the group.

In this configuration, as in (1) described above, even in the case where the positioning operation is effected for a plurality of charged beam optical systems at the same time, the intrusion of the reflected particles from other marks can be prevented, thereby improving both the drawing throughput and the drawing accuracy.

(3) A charged beam lithography apparatus of multi-beam type having a plurality of charged beam optical systems, comprises: a workpiece stage having a plurality of reference marks formed at positions corresponding to the plurality of charged beam optical systems; means for moving the workpiece stage; means for scanning a charged beam on each reference mark moved with the movement of the workpiece stage and measuring the position of each reference mark; means for storing relative positions of the reference marks thus measured; means for correcting the position of each charged beam lithography area based on the relative positions of the reference marks stored in the storing means; and means for drawing based on the corrected drawing position. A charged beam lithography method using a charged beam lithography apparatus of multi-beam type for correcting the drawing position using a plurality of reference marks formed on a workpiece stage corresponding to the charged beam optical systems, respectively, comprises the steps of: detecting mark positions in the plurality of charged beam optical systems; detecting the mark positions using a reference mark in at least an adjacent charged beam optical system; calculating relative positions of the reference marks; correcting the positions of the drawing areas of the charged beam optical systems based on the result of the calculation; and drawing at each corrected drawing position.

After the mark positions are detected in each charged beam optical system, the mark positions are detected using reference marks of adjacent charged beam optical systems. In this way, relative positions of the drawing areas of adjacent charged beam optical systems are measured. In the actual drawing operation, the drawing position is corrected, thus making possible an improved connection accuracy and a higher drawing accuracy.

(4) A charged beam lithography method using a charged beam lithography apparatus of multi-beam type having a plurality of charged beam optical systems, comprises the step of drawing in such a manner that adjacent charged beam optical systems have overlapped deflection boundary areas. Further, the charged beam lithography method further comprises the step of correcting the amount of irradiation in the overlapped areas.

The deflection area boundaries of adjacent charged beam sources are overlapped one on the other, and the amount of irradiation in the overlapped area is corrected. The connection displacement in the drawing area attributable to the difference in the beam characteristics between the charged beam sources can be eliminated and the drawing accuracy can be improved.

As described above, according to the present invention, even when the positioning operation is performed for a plurality of charged beams at the same time, the particles reflected from other marks are prevented from intruding the intended mark. Also, the positioning operation can be accomplished at the same time for a plurality of charged beams, thereby considerably reducing the drawing time.

Also, according to the present invention, even in the case of a pattern drawing requiring a drawing area larger than the pitches at which the charged beam optical systems are arranged or even in the case where a drawing operation is carried out in a plurality of charged beam optical systems in a lithography apparatus of multi-beam type, the connection accuracy at the drawing area boundary of the charged beam is especially improved, thereby making possible a high-accuracy drawing.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B are diagram showing a beam deflection distortion;

FIG. 2 is a diagram showing a conventional electron beam optical system;

FIGS. 3A and 3B are diagrams showing a plan view and a sectional view of a mark, respectively;

FIGS. 7A and 7B are diagrams showing the displacement assumed between an ideal arrangement of reference marks and an actual mark arrangement;

FIG. 8 is a diagram showing the manner in which the drawing areas are displaced due to the displaced positions of the reference marks;

FIG. 9 is a diagram showing the displacement in the drawing area boundaries of electron beam optical systems;

FIG. 15 is a diagram showing the relation between a chip and positioning marks according to the embodiment 1-2;

FIG. 16 is a diagram showing a collimator structure according to the embodiment 1-3;

FIG. 22 is a diagram showing the manner in which a mark is detected according to a third embodiment;

FIGS. 23A and 23B are diagrams showing a method of measuring the position of a reference mark;

FIGS. 24A and 24B are diagrams showing a method of measuring the position of a reference mark;

FIG. 27 is a diagram showing an example a multiple drawing;

FIGS. 28A and 28B are diagrams showing beam adjusting marks and the positions thereof on a stage;

FIG. 29 is a diagram showing a drawing area for each electron beam source;

DETAILED DESCRIPTION OF THE INVENTION

Embodiments of the present invention will be explained in reference to the drawings.

First Embodiment

Figure 10:
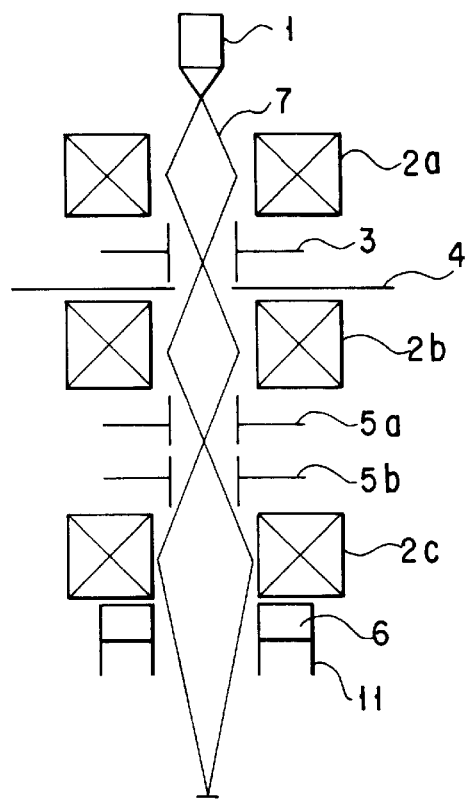
FIG. 10 is a diagram showing an optical system of an electron beam lithography apparatus according to a first embodiment.

FIG. 10 is a diagram showing an electron beam optical system of an electron beam lithography apparatus of multi-beam type according to a first embodiment of the present invention. This electron beam optical system includes an electron gun 1, beam blanking systems 3, 4, beam deflection systems 5a, 5b, beam adjusting lens systems 2a, 2b, 2c and a reflected electron detector 6.

In detecting a mark position, a beam is scanned on the mark corresponding to each electron beam. In the conventional electron beam optical system, however, as shown in FIGS. 7A and 7B, the reflected electron detector is exposed. In the case where a mark is detected by a plurality of electron beams, therefore, the electrons reflected from other marks intrude the detector sideway, thereby making it difficult to detect individual mark positions.

Figure 11:
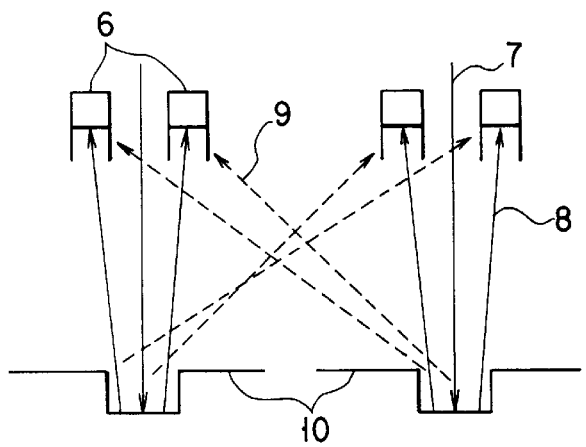
FIG. 11 is a diagram showing the effects obtained when a mark is detected by a plurality of beams.

According to the present embodiment, in contrast, as shown in FIG. 10, a collimator 11 is mounted on the reflected electron detector 6. As a result, as shown in FIG. 11, even in the case where the position of the mark 10 is detected by a plurality of beams 7 at the same time, the reflected electron 8 from the corresponding mark 10 is detected in the same manner as in the prior art while at the same time preventing the intrusion of the reflected electrons 9 from other marks 10. Even when the beam is deflected in the range of several mm as in correcting the deflection distortion, the reflected electrons 9 from other marks 10 can be selectively removed by adjusting the aperture angle.

As described above, according to the embodiment, the collimator 11 mounted on the reflected electron detector 6 can remove the reflected electrons 9 from other marks 10. As a result, even when the positioning operation is performed by a multiplicity of electron beams 7 at the same time, a mark position can be detected independently by individual electron beams, thereby shortening the drawing time remarkably.

Now, explanation will be made about a specific example of the first embodiment.

Embodiment 1-1

Figure 12:
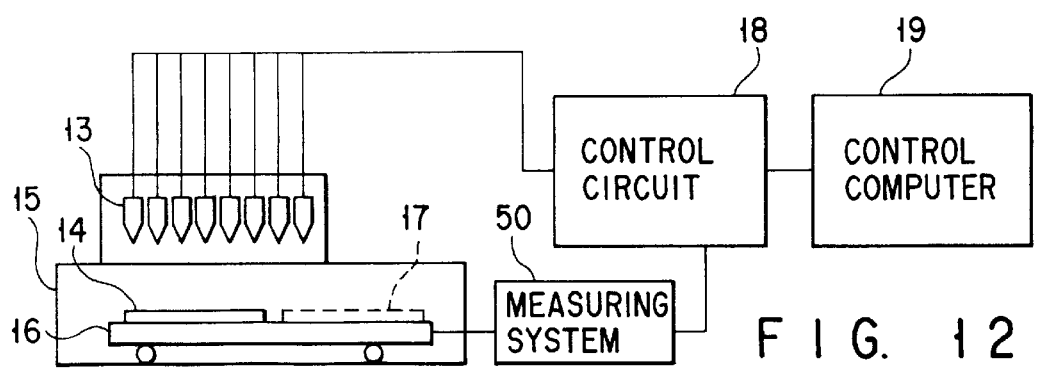
FIG. 12 is a diagram schematically showing a configuration of an electron beam lithography apparatus according to the embodiment 1-1.

FIG. 12 is a diagram schematically showing an electron beam lithography apparatus of multi-beam type according to this embodiment. FIG. 12 shows a configuration including an electron beam optical system 13, a workpiece 14, a workpiece room 15, a stage 16, a reference mark 17, a control circuit 18, a control computer 19 and a stage measuring system 50.

This lithography apparatus uses an acceleration voltage of 10 kV. The drawable range is 150 mm square. A total of 225 (=15×15) electron beam optical systems are arranged at pitches of 10 mm. The beam deflection system 13 is configured on double stages of a main-stage and a sub-stage by electrostatic deflection. The size of the deflection area is 50 μm for main-deflection and 100 μm for sub-deflection. The drawing area of each electron beam optical system 13 is ±5 mm about the electron gun. This drawing area is drawn with 400 main-deflection areas.

Figure 4:
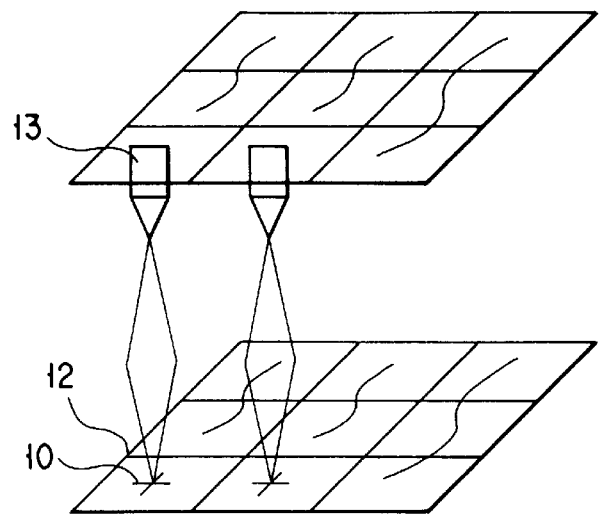
FIG. 4 is a diagram showing the manner in which marks are detected.

The stage 16 has mounted thereon a plurality of beam adjusting marks as shown in FIG. 4. There are a total of 15×15 beam adjusting marks each to make up a pair with the corresponding one of the electron beam optical systems 13, respectively, each being arranged within the drawing area of each electron beam optical system 13. The mark is in the cross-shape as shown in FIGS. 3A and 3B, and is formed by being dug in a Si substrate by light exposure and plasma etching. The size of each mark is 100 μm on each side, 5 μm in width and 2 μm in depth.

According to this embodiment, the reflected electron detector 6 of each electron beam optical system 13 includes a collimator 11 as shown in FIG. 10. The collimator 11 has a cylindrical shape.

The correction of the deflection distortion in the electron beam lithography apparatus of multi-beam type will be explained with reference to FIG. 13. The deflection distortion is corrected in the manner described below.

First, the main-deflection area of 500 μm is divided into 50-μm meshes, and the stage is moved in such a manner that a reference mark 20 is located at a lattice point thereof. Then, the beam is deflected and scanned on the mark 20. From the beam deflection amount and the mark position, the deflection voltage at the mark center is calculated. As indicated by arrow 22, the reference mark is sequentially moved to store the deflection amount. A similar operation is performed also for a sub-deflection area of 100 μm square in size. The mesh size of 5 μm is involved.

The distortion for 15×15 beams could be corrected at the same time without any problem for each electron beam optical system. The beam adjustment required one minute. The beam adjustment, if effected for each one of 15×15 beams, consumes 225 minutes (about three hours and 30 minutes). According to the present embodiment, in contrast, the simultaneous adjustment for the 15×15 beams could shorten the beam adjusting time to 1/225. Also, as a result of a normal drawing effected after the deflection distortion adjustment, a highly accurate drawing was possible.

Embodiment 1-2

Figure 14:
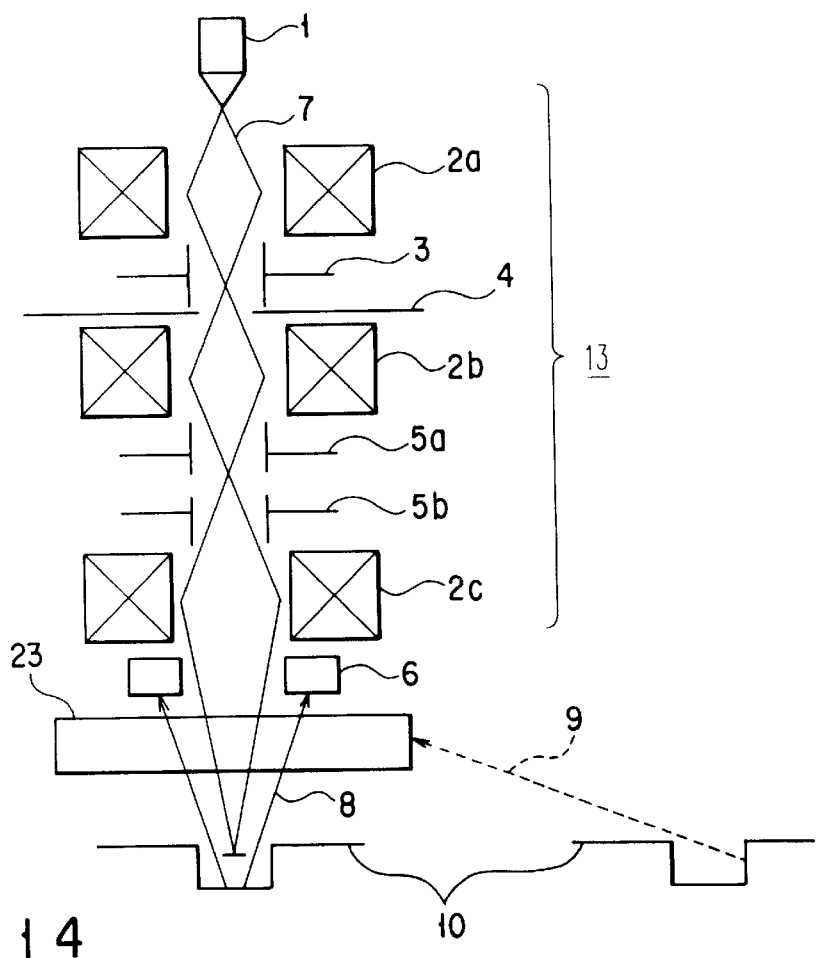
FIG. 14 is a diagram schematically showing a configuration of an electron beam lithography apparatus according to the embodiment 1-2.

In this embodiment, the reflected electron detector 6 of each electron beam optical system includes a collimator 23 as shown in FIG. 14. The collimator 23 according to this embodiment, which is cylindrical in shape like in the embodiment 1-1, is provided to surround each electron beam optical system but not on each reflected electron detector 6. In this case, the electron beam lithography apparatus of multi-beam type is used for positioning with respect to the base pattern formed on the Si substrate.

As shown in FIG. 15, a plurality of chips 25 are arranged on a wafer 26. Each chip 25 has a size of 10 mm square, and has positioning marks 24 at the four corners thereof. These marks 24 are recessed by being dug in the Si substrate by exposure to light and plasma etching. The size of each mark 24 is 100 μm on each side, 5 μm in width and 2 μm in depth. One chip of each electron beam optical system is drawn at the same time. The positioning operation is effected in the manner described below.

The position of the wafer on the stage is checked by wafer alignment marks 27 formed at separate points with respect to the chip 25. Then, the mark positions in each chip 25 are calculated from the chip layout information on the wafer 26. The stage is moved on the basis of the mark position of each chip 25 thus calculated, and the mark position is detected. In this way, the positions of the four marks in the chip 25 are sequentially detected. In this case, the chips are arranged at the same pitches as the electron beam optical systems, and therefore the mark positions can be detected at the same time by 15×15 beams without any special technique.

As a result of simultaneous detection of the positioning marks 24 for the 15×15 beams, the positioning operation could be carried out without any problem for each electron beam optical system. Each beam adjustment consumes one minute for a total of 4 minutes for one chip. The one-by-one beam adjustment conducted for 15×15 beams consumes 12 hours. This embodiment, in which the 15×15 beams are adjusted at the same time, can shorten the positioning time to 1/225. Further, the normal drawing carried out after positioning can produce a high-accuracy drawing.

Embodiment 1-3

Figure 17:
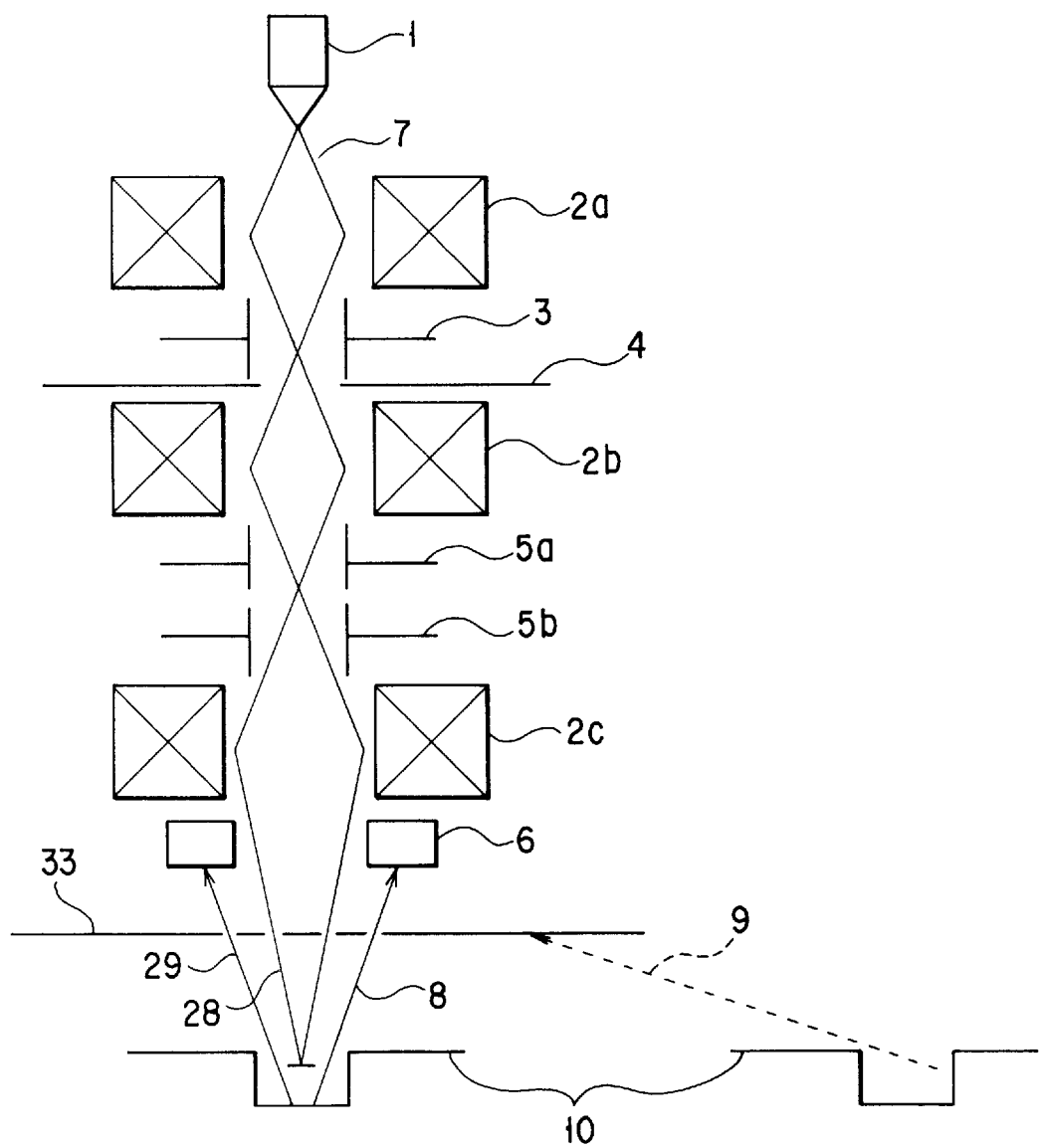
FIG. 17 is a diagram showing the arrangement of an electron beam optical system and a collimator according to the embodiment 1-3.

According to this embodiment, a shielding plate 31 with apertures as shown in FIG. 16 is used as a collimator with the reflected electron detector of each electron beam optical system. This collimator 31 is installed between the workpiece and the electron beam optical system as shown in FIG. 17. In FIG. 16, reference numeral 28 designates pass holes of electron beams, reference numeral 29 designates apertures for the reflected electron detector, and reference numeral 30 designates a drawing area of the electron beam optical system.

As a result of positioning and drawing effected in a manner similar to the embodiment 1-2 using the collimator 31, the positioning operation could be accomplished without any problem. Also, normal drawing could be effected with high accuracy after positioning.

The present invention is not limited to the shape of the collimator. Other shapes of collimator than shown in the embodiments can be used with equal effect. Further, the invention is not intended to limit the lithography apparatus and the drawing method. In addition to the apparatuses and methods shown as embodiments above, a lithography apparatus of a type with a single beam split into a plurality of beams by apertures, for example, is applicable according to the invention. Also, the invention is not limited in the shape or type of the mark. Other marks such a protrusion using a heavy metal, for example, is applicable in addition to those shown in the embodiments.

Second Embodiment

Figure 18:
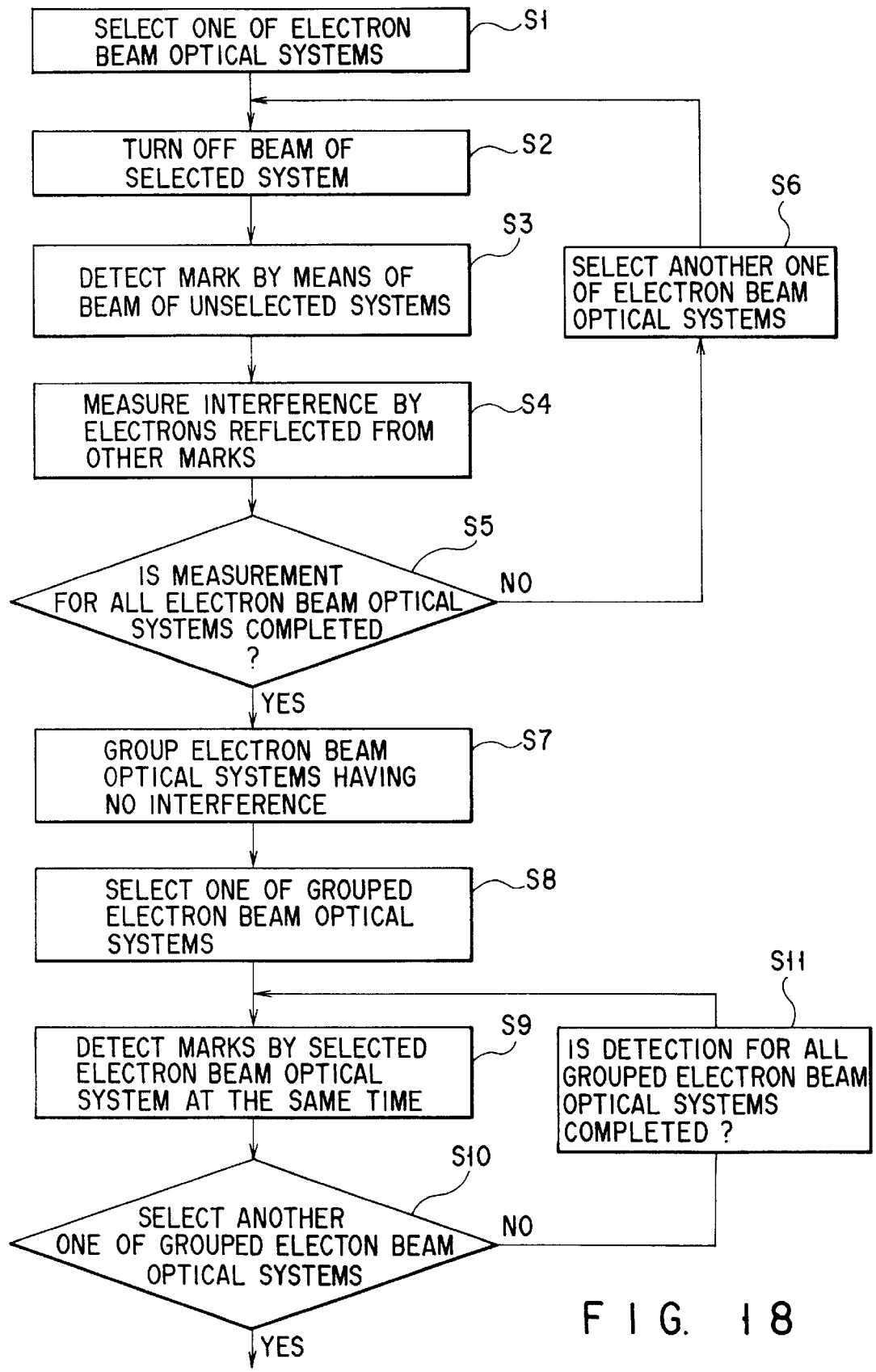
FIG. 18 is a diagram showing the steps of a drawing method according to a second embodiment.
Figure 19A:
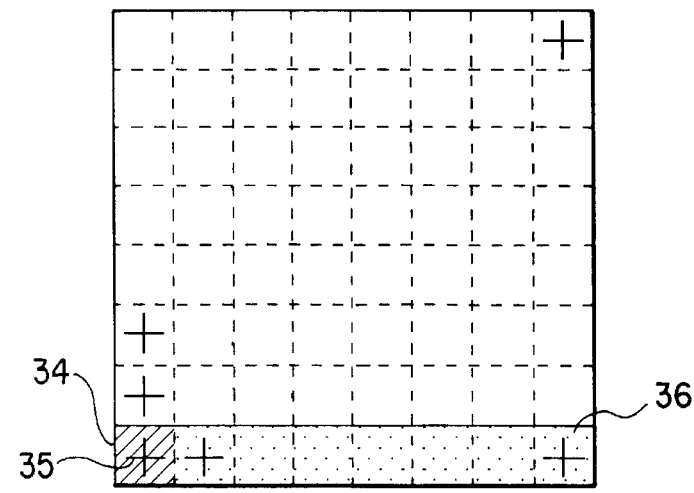
FIGS. 19A to 19E are diagrams showing the steps of grouping the electron beam optical systems in the embodiment 2-1.
Figure 19B:
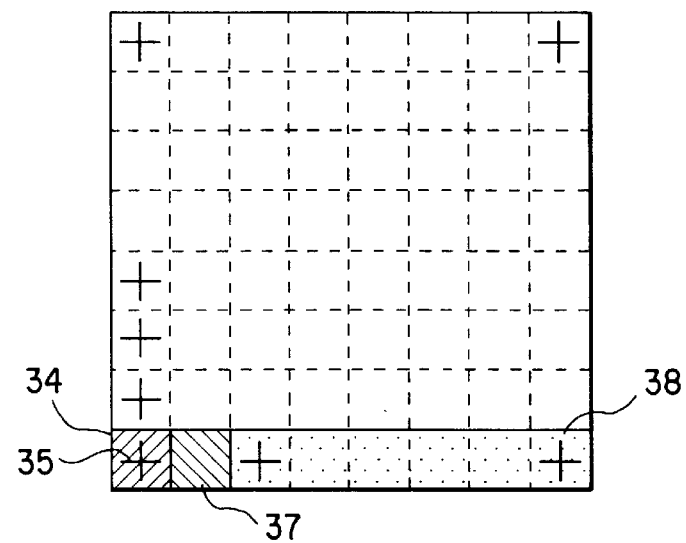
Figure 19C:
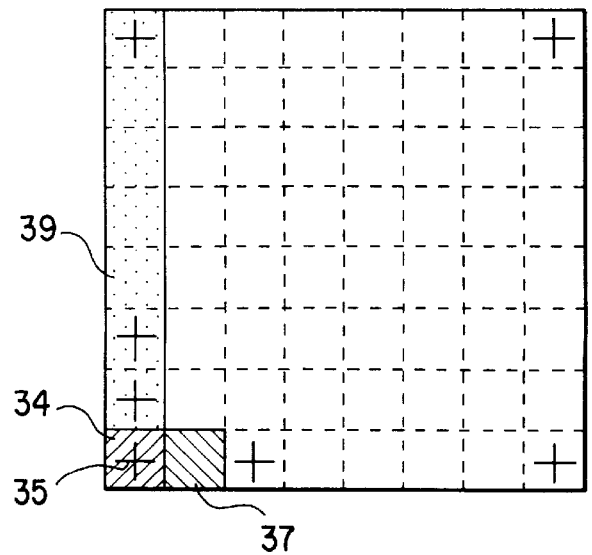

Now, a second embodiment of the invention will be explained with reference to the flowchart of FIG. 18. For simplicity of explanation, an electron beam lithography apparatus will be referred to with an array of 64 (=8×8) electron beam sources as shown in FIGS. 19A to 19C.

An electron beam lithography apparatus according to this embodiment performs the following operations:

(1) One of a plurality of electron beam optical systems is selected (S1).
(2) The beam of the electron beam optical system thus selected is turned off (S2).
(3) The marks are sequentially detected in the electron beam optical systems other than the one selected (S3).
(4) The interference of the selected electron beam optical system by the particles reflected from other marks is measured (S4).
(5) The above-mentioned operation is repeated for all the electron beam optical systems (S5, S6).
(6) The electron beam optical systems free of interference are grouped (S7).
(7) One of the electron beam optical systems in the group is selected (S8).
(8) A plurality of mark positions are detected at the same time using the electron beam optical system thus selected (S9).
(9) The above-mentioned operation is repeated for all the groups (S10, S11).

In the step S4 described above, the interference of the reflected electrons from other electron beams is measured. Assuming that the selected electron beam optical system is designated by reference numeral 35 and the drawing area of the particular electron beam optical system is designated by reference numeral 34 in the diagram, for example, this beam is blanked. At the same time, assume that a mark is detected by the electron beam in the column designated by reference numeral 36 in the diagram. If the particular electron beam is an adjacent electron beam corresponding to reference numeral 37 in the diagram, the reflected electrons jump into the reflected electron detector of the electron beam optical system designated by reference numeral 35 in the diagram (FIG. 19A). As for the other electron beam optical systems designated by reference numeral 38 in the diagram, on the other hand, no reflected electrons are detected, or if detected, the amount thereof is at the same level as noises (FIG. 19B).

Figure 19D:
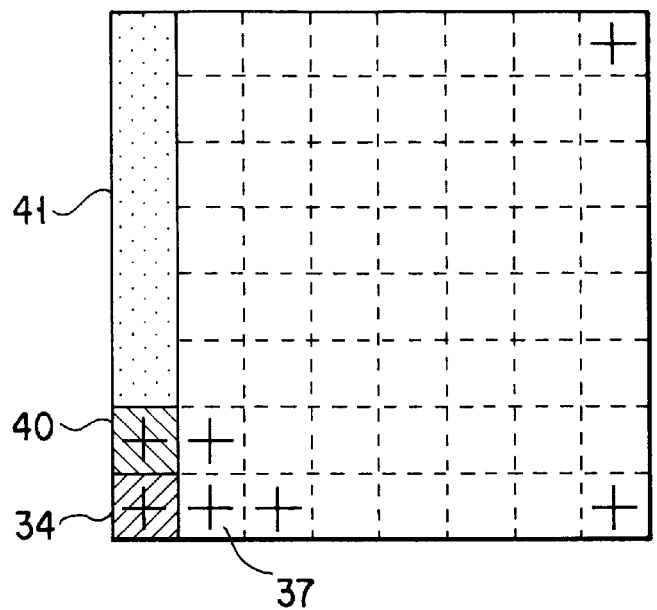
Figure 19E:
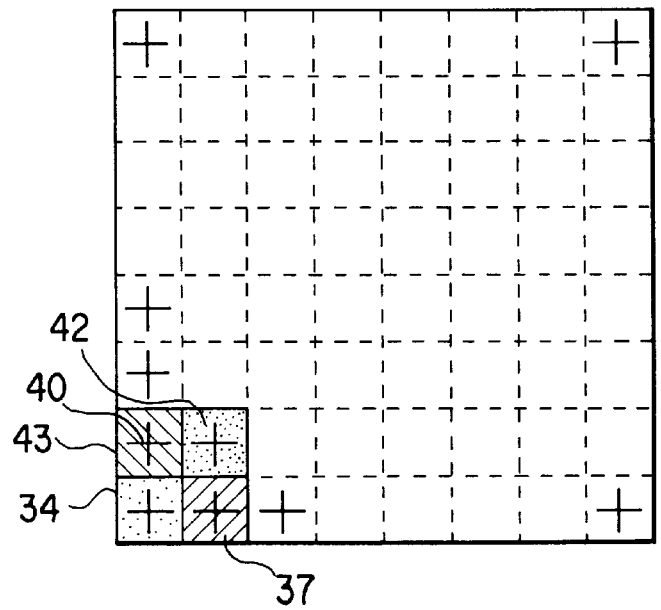

Then, the electron beam optical systems are sequentially selected from those in the column designated by reference numeral 39 in the diagram, and the interference of the reflected electrons is measured in similar fashion (FIG. 19C). In the case under consideration, assume that the reflected electrons interfere in the adjacent electron beam optical system designated by reference numeral 40 in the diagram, for example, but also assume that no reflected electrons are detected in the other electron beam optical systems designated by reference numeral 41 in the diagram (FIG. 19D). In this way, as shown by reference numeral 43 in the diagram, a minimum unit of interference of the reflected electrons can be determined. In such a case, the marks cannot be detected at the same time within the area designated by reference numeral 43 in the diagram, and therefore the area is set to different groups (designated by reference numerals 34, 37, 40, 42 in the diagram) (FIG. 19E).

In the step S7 described above, as shown in FIG. 20, the minimum unit of reference numeral 43 in the diagram is applied to the whole electron beam array. As a result, the electron beams free of mutual interference of reflected electrons can be divided into four groups.

The groups determined in steps Si to S7 are free of interference of the reflected electrons even when the marks are detected at the same time, and therefore the mark positions can be detected without any problem. In such a case, the marks of all the electron beam optical systems can be detected only in four sessions. Consequently, the time of mark detection is reduced to one-sixteenth as compared with the case where marks are detected for all the 64 electron beam optical systems. The beam adjustment and positioning operation can thus be accomplished for a plurality of electron beam optical systems at the same time, thereby considerably reducing the drawing time. Although the electron beam optical systems are assumed to form an 8×8 array for the sake of simplicity in this embodiment, marks can be detected in similar fashion for an electron beam optical system having a larger array of 10×10, for example.

Now, the invention will be described more specifically with reference to a second embodiment.

Embodiment 2-1

A configuration of a multi-beam lithography apparatus according to this embodiment is schematically shown in FIG. 12. The acceleration voltage of this apparatus is 10 kV. The drawable range is 80 mm square, and a total of 64 (=8×8) electron beam optical systems are arranged at pitches of 10 mm. The beam deflection system is in two stages, main and subsidiary, for electrostatic deflection. The size of the deflection area is 500 $\mu$m for main-deflection, and 100 $\mu$m for sub-deflection. The drawing area of each electron beam is ±5 mm about the electron gun. Four hundred main-deflection areas are used for drawing in this drawing area.

Figure 5:
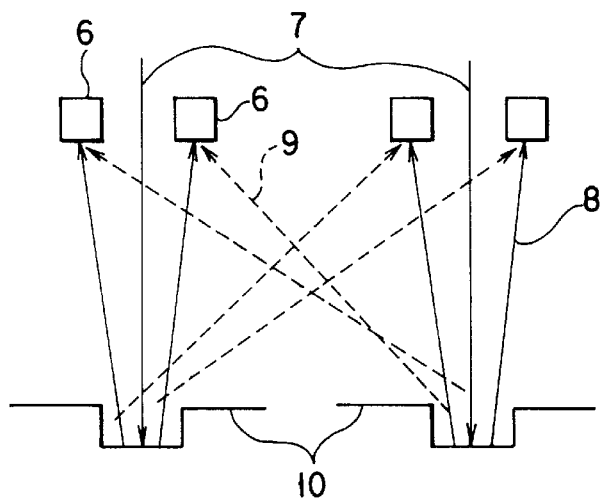
FIG. 5 is a diagram showing the problem points posed when a mark is detected by a plurality of beams.
Figure 6:
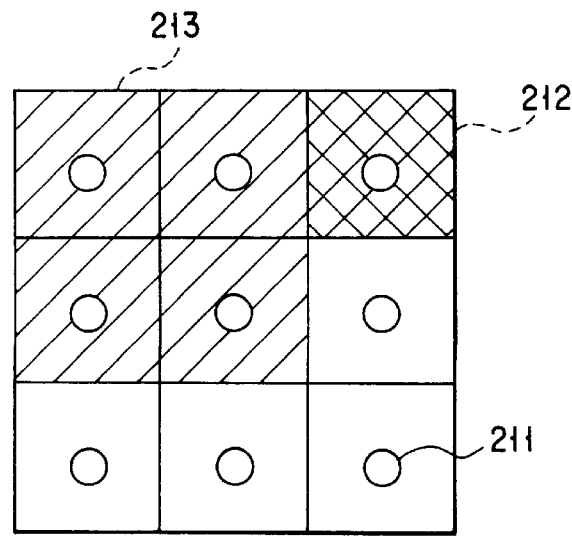
FIG. 6 is a diagram showing a method of drawing using an electron beam lithography apparatus of multi-beam type.

A plurality of beam-adjusting marks are formed on the stage as shown in FIG. 6. There are 8×8 marks each to make up a pair with a corresponding electron beam optical system, respectively, each mark being formed in the drawing area of each electron beam optical system. The shape and size of each mark are identical as those described with reference to FIG. 5.

According to this embodiment, the deflection distortion of the electron beam lithography apparatus of multi-beam type is corrected. Prior to the correction of deflection distortion, the electron beam optical systems are divided into groups. Explanation will be made below with reference to FIGS. 19A to 19E and 20.

Figure 20:
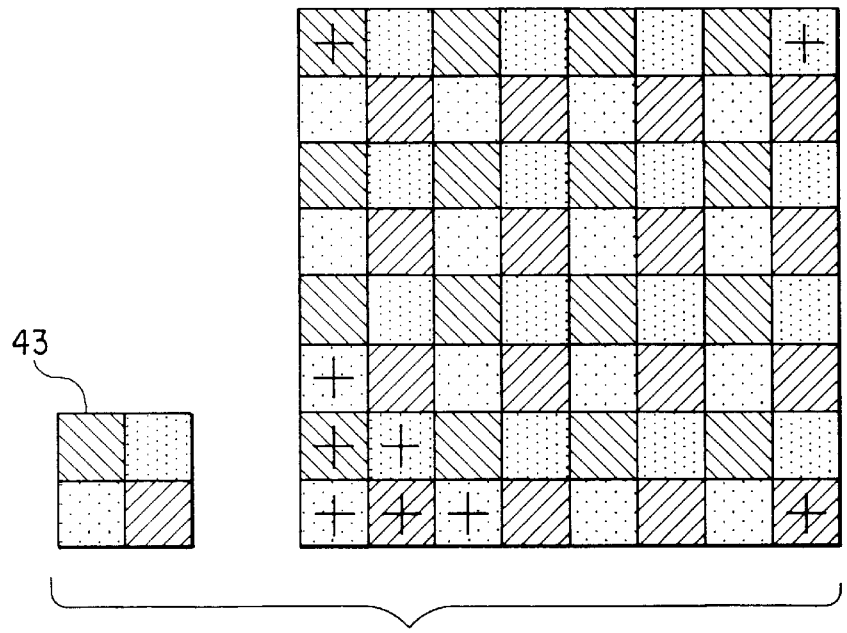
FIG. 20 is a diagram showing the manner in which the electron beams are grouped.

1) An electron beam optical system (reference numeral 35 in the diagram) is selected.
2) The beam of this electron beam optical system is blanked.
3) A mark is detected in an electron beam optical system on the column designated by reference numeral 36 in the diagram.
4) In the case of the adjacent electron beam optical system corresponding to reference numeral 37 in the diagram, the reflected electrons are detected by the reflected electron detector of the electron beam optical system designated by reference numeral 35.
5) As for the other electron beam optical systems designated by reference numeral 38 in the diagram, substantially little reflected electrons are detected.
6) Then, the electron beam optical systems are sequentially selected from those on the column 39, and the interference of the reflected electrons was measured in similar manner. Although the reflected electrons interfere with the electron beam in the adjacent optical system 40, no reflected electrons were detected in the other electron beam optical systems designated by reference numeral 41 in the diagram.
7) As a result of the above-mentioned measurement, the minimum unit of interference of the reflected electrons made up of the four electron beam drawing areas designated by reference numeral 43 in FIG. 19D was determined.
8) The area designated by reference numeral 43 in the diagram is set in different areas (reference numerals 34, 37, 40, 42).
9) A plurality of the minimum units set in (8) above are arranged in an 8×8 array as shown in FIG. 20.

In the above-mentioned manner, four subgroups each having 16 electron beam optical systems are formed in each group, and the related information is stored in a control computer.

The deflection distortion is corrected in the manner described below.

Figure 13:
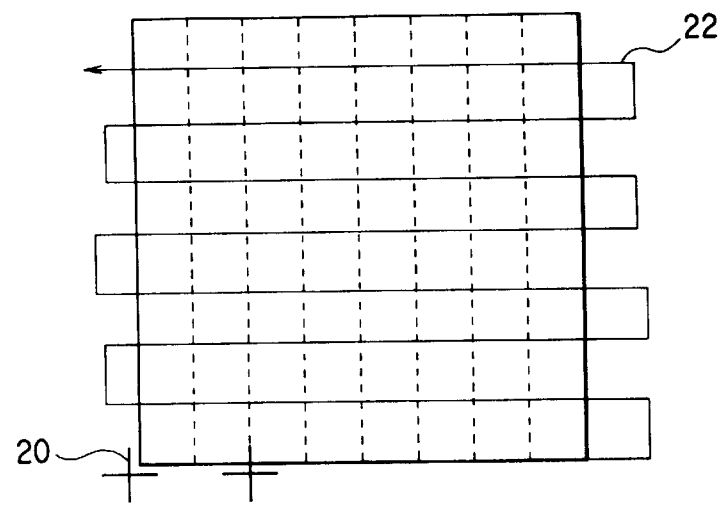
FIG. 13 is a diagram showing the shape of a beam adjusting mark according to the embodiment 1-1.

1) As shown in FIG. 13, the main-deflection area of 500 $\mu$m is split into 50-$\mu$m meshes, and the stage is moved in such a manner that the reference mark is located at the lattice points thereof.
2) Sixteen beams are selected from the first group.
3) The 16 beams are deflected at the same time and scanned on the marks.
4) From the beam deflection amount and the mark positions, the deflection voltage at the mark center is calculated.
5) The steps (3) to (4) are repeated for the second to fourth groups.
6) The reference mark is moved in the same way as indicated by arrow 22 in FIG. 13, and the steps (2) to (5) are repeated.
7) The operation similar to steps (1) to (6) is performed also for the sub-deflection area of 100 $\mu$m square. A mesh size of 5 $\mu$m is involved.

The above-mentioned operation is first performed at the same time by 16 out of 8×8 beams for the first to fourth groups. Consequently, the deflection distortion could be smoothly corrected for each electron beam optical system. Each beam adjustment consumed one minute, so that four minutes are required for correcting the deflection distortion for the four groups with 8×8 beams. In the case where the 8×8 beams are adjusted one by one, about an hour is consumed. In contrast, according to this embodiment, the simultaneous adjustment of the 8×8 beams can shorten the time for deflection distortion correction to about one sixteenth. Also, normal drawing after deflection distortion correction can be accomplished with high accuracy.

Embodiment 2-2

According to this embodiment, the base pattern formed on a Si substrate was used for positioning in an electron beam lithography apparatus of multi-beam type.

The chip size is 10 mm square, with positioning marks attached at the four corners of the chip as shown in FIG. 15. These marks are in the form of a recess dug into the Si substrate by light exposure and plasma etching. The size of each mark is 100 $\mu$m on each side, 5 $\mu$m wide, and 2 $\mu$m deep. The drawing operation is performed for the whole chip of each electron beam optical system at the same time. The positioning operation is performed in the manner described below.

First, wafer alignment marks formed in an area separate from the chips are optically detected, and the wafer position on the stage is checked. Then, the mark positions in each chip are calculated from the chip layout information on the wafer. On the basis of the mark positions of each chip thus calculated, the stage is moved in order to measure the mark positions of the first group in the first place. The mark position detection is sequentially conducted for each chip of the first to fourth groups. Then, the mark positions are measured for the second to fourth groups in similar fashion. Since the chips are arranged at the same pitches as the electron beam optical systems, the stage is moved four times in accordance with the mark positions in the chip.

The positioning marks are detected at the same time for each of the four groups making up 8×8 beams. As a result, the positioning operation can be performed without any problem for each electron beam optical system. Each beam adjustment takes 15 seconds for a total of one minute per chip. Consequently, four minutes are consumed for positioning the 8×8 beams. This compares with about one hour required if beam adjustment is carried out for each beam. The simultaneous adjustment of the 8×8 beams according to this embodiment reduces the positioning timne to about one sixteenth. After positioning, normal drawing was accomplished with high accuracy.

Embodiment 2-3

According to this embodiment, the electron beam optical systems are divided into groups by simulation on the computer. In actual device fabrication, a GaAs substrate or a film of W or the like heavy metal is used as a workpiece. Once the electron beam optical systems are divided into groups by computer, no grouping work is required for each of a great variety of substrates.

Figure 21:
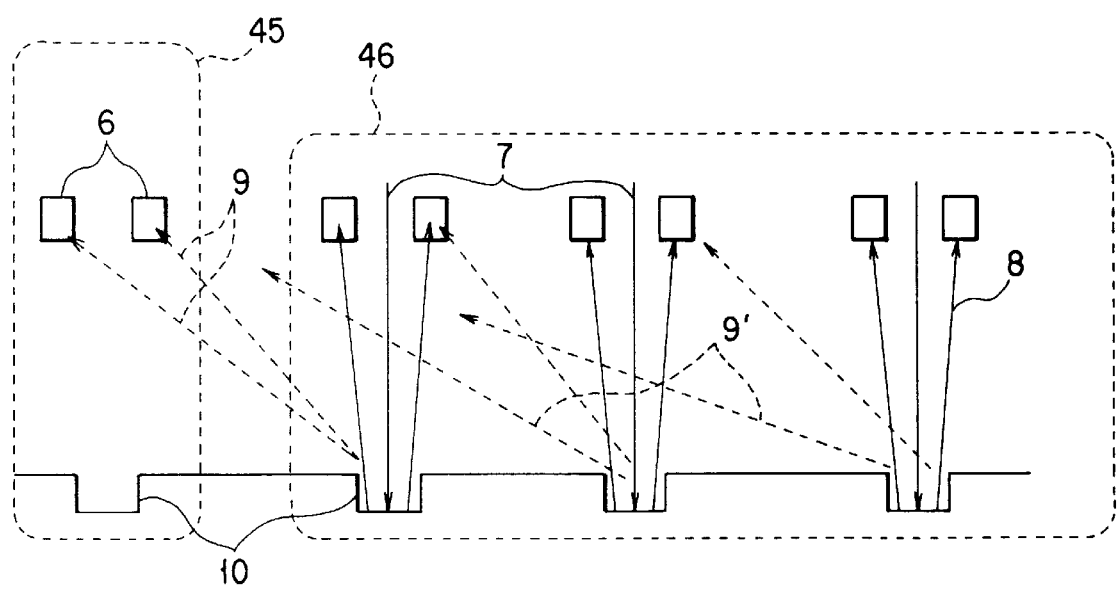
FIG. 21 is a diagram showing a configuration of a multi-beam lithography apparatus reproduced on a computer program.

First, an electron beam lithography apparatus of multi-beam type according to this embodiment is reproduced on a computer program. As shown in FIG. 21, only the one-dimensional computation is performed.

An electron accelerated to 10 kV is applied on the Si substrate, and the marks are sequentially detected in the electron beam optical systems on the column 46 in the diagram. The degree of interference with the electron beam optical system 45 in the diagram was calculated. The reflected electrons 9 from the immediately adjacent mark are detected by the reflected electron detector of the electron beam optical system 45. The reflected electrons 9' from other than the immediately adjacent mark, on the other hand, are not substantially detected by the reflected electron detector of the electron beam optical system 45. The result of calculation in the one-dimensional space expanded to the two-dimensional space made possible the same grouping as in FIG. 20.

When the electron beam optical systems are grouped by computer, the range covered by the reflected electrons can be determined from such data as the quantity and angle of the reflected electrons based on the Monte Carlo calculation even when a GaAs substrate or a heavy metal such as W is assumed as a workpiece. The need has been eliminated, therefore, of grouping for each of a great variety of different substrates.

The electron beams are divided into groups and the positioning and drawing operations are carried out in the same manner as in the embodiment 2-2. As a result, the positioning operation could be performed without any problem. Also, the normal drawing conducted after positioning leads to a high-accuracy drawing result.

The present invention is not limited to the lithography apparatuses and the lithography methods described above. It is applicable also to a lithography apparatus in which a single beam is divided into a plurality of ones by apertures. Nor the invention is confined to the shape and type of the mark described above. Other marks to which the invention is applicable than shown in the above-mentioned embodiments include a protruded mark using a heavy metal, for example.

Third Embodiment

Now, a third embodiment of the invention will be explained. By way of simplicity, reference will be made to an electron beam lithography apparatus having an array of 9 (=3×3) electron beam sources. Each electron beam optical system is formed with a corresponding reference mark as shown in FIG. 22. Reference numeral 7 designates an electron beam, reference numeral 10 a mark, reference numeral 13 an electron beam optical system, and reference numeral 52 a drawing area by an electron beam optical system.

It is difficult to arrange the reference marks at an ideal position as shown in FIG. 7A. In fact, they are distorted as shown in FIG. 7B. When such reference marks are used, the reference mark positions are so displaced that in the case where a chip is drawn by a plurality of electron beam optical systems, the pattern position is displaced in the drawing area boundary of each electron beam optical system.

According to this embodiment, the positions of not only the reference mark corresponding to each electron beam optical system but the reference mark of an adjacent electron beam optical system are measured in order to measure relative displacements of all the reference marks. Assume, for example, that the reference mark in the first row and the first column is selected as an origin, and also that the reference marks are displaced as shown in FIG. 8. For simplicity of explanation, each 100 μm is expressed as a unity.

First, each mark is moved about each electron beam optical system to detect the mark position. As shown in FIGS. 23A and 23B, the marks are moved along Y direction by the distance equivalent to the pitch at which the electron beam optical systems are arranged, and the positions of the reference marks of adjacent electron beam optical systems are measured. Further, the stage is moved in the opposite direction and the reference mark positions of the adjacent electron beam optical systems are measured. By doing so, the amount of displacement in X and Y directions of each reference mark position between rows can be determined for each column. Reference numeral 47 designates a fixed electron beam arrangement, and reference numeral 48 the stage position moved.

Let each electron beam optical system on the first row be a reference (0, 0). The position of the reference mark along each column is given as

|  | Column 1 | Column 2 | Column 3 |  |
| --- | --- | --- | --- | --- |
| Row 1 | (0, 0) | (0, 0) | (0, 0) |  |
| Row 2 | (1, 0) | (−1, 0) | (0, 0) |  |
| Row 3 | (0, 1) | (0, 1) | (1, −1) | (×100 μm) |

As shown in FIGS. 24A and 24B, the stage is moved also in X direction thereby to measure the mark position displacement between columns in the same manner as between rows. With each electron beam optical system on the first column as a reference, assume that the reference mark displacement on the first row is expressed as

|  | Column 1 | Column 2 | Column 3 |  |
| --- | --- | --- | --- | --- |
| Row 1 | (0, 0) | (1, 0) | (0, −1) | (×100 μm) |

By adding this value to the first measurement, the relative positions of the reference marks can be determined with the reference mark on the first line and on the first column as an origin.

|  | Column 1 | Column 2 | Column 3 |  |
| --- | --- | --- | --- | --- |
| Row 1 | (0, 0) | (1, 0) | (0, −1) |  |
| Row 2 | (1, 0) | (0, 0) | (0, −1) |  |
| Row 3 | (0, 1) | (1, 1) | (1, −2) | (×100 μm) |

The position of the drawing area is corrected based on this result. The pattern position displacement in the drawing area boundary due to the difference in reference mark among the electron beam optical systems can thus be reduced. In the shown example, the drawing position is corrected in the following-described manner to reduce the relative position displacement of the reference marks to zero.

|  | Column 1 | Column 2 | Column 3 |  |
| --- | --- | --- | --- | --- |
| Row 1 | (0, 0) | (−1, 0) | (0, 1) |  |
| Row 2 | (−1, 0) | (0, 0) | (0, 1) |  |
| Row 3 | (0, −1) | (−1, −1) | (−1, 2) | (×100 μm) |

Figure 25:
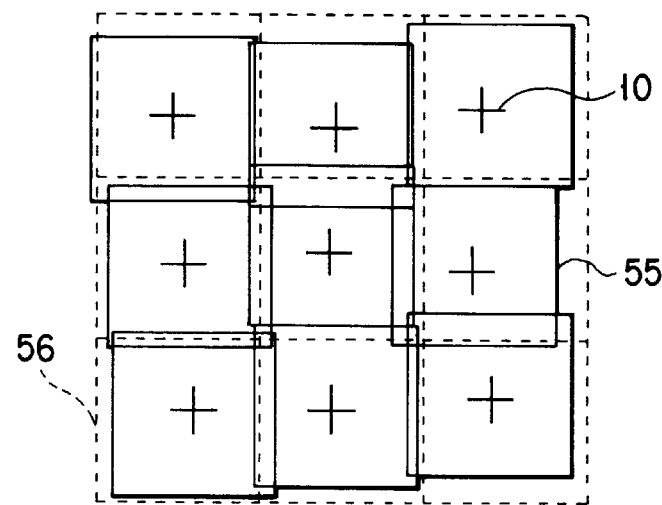
FIG. 25 is a diagram for explaining the effects of correcting the drawing position.

The drawing position is corrected by changing the amount of beam deflection in each electron beam optical system. As a result, the corrected drawing position, as indicated by reference numeral 56 in FIG. 25, can be adjusted without being overlapped with the drawing area of adjacent electron beam optical systems. In the diagram, reference numeral 55 designates the drawing position before correction, and reference numeral 56 the drawing position after correction.

In this way, the connection accuracy can be improved in the drawing area boundary of each electron beam optical system. The adjustment of beam deflection distortion or the mark detection in each electron beam optical system can be accomplished for each electron beam optical system. The drawing throughput of the multi-beam lithography apparatus can therefore be improved. Although the foregoing description refers to an array of 3×3 electron beams to facilitate the understanding, the drawing area can be corrected in similar fashion even for a larger 100×100 array of electron beams.

Now, more specific examples of the third embodiment will be explained.

Embodiment 3-1

A configuration of a multi-beam lithography apparatus according to this embodiment is schematically shown in FIG. 12. Each electron beam optical system has a similar configuration to the one shown in FIG. 2.

The acceleration voltage of this lithography apparatus is 10 kV. The drawable range is 80 mm square. A total of 64 (=8×8) electron beam optical systems are arranged at pitches of 10 mm. The beam deflection system is in double stages, main and subsidiary, and uses an electrostatic deflection. The size of the deflection area for main-deflection is 500 $\mu$m, and that for sub-deflection is 100 $\mu$m. The drawing area of each electron beam optical system is ±15 mm about the electron gun. This drawing area is assumed to be covered by 400 main-deflection areas.

Upon detection of a mark position, the related information is sent to a control computer and stored there. After mark detection, the displacement of each reference mark is calculated based on the stored mark position information. After that, the position of the drawing area of each electron beam optical system is corrected, and the correction information is sent to a control circuit. In the drawing operation, the control computer sends the drawing data to the drawing control circuit of each electron beam optical system. At the same time, the correction data of the drawing area is used to correct the drawing position.

A plurality of beam adjusting marks are attached on the stage as in the case of FIG. 22. Unlike in FIG. 22 expressed as a 3×3 array, there are 8×8 marks corresponding to the electron beam optical systems to form a corresponding number of pairs therebetween, with each mark being formed in the drawing area of each electron beam optical system. The mark is shaped in a cross as shown in FIGS. 3A and 3B. Each mark is formed by being dug in the Si substrate by light exposure and plasma etching. The mark has a size of 100 $\mu$m on each side, 5 $\mu$m wide and 2 $\mu$m deep.

According to this embodiment, a photomask of 80 mm square was drawn. First, in each electron beam optical system, the distortion of the main and sub-deflection areas is corrected using the reference mark. Then, the drawing area of each electron beam optical system is corrected in the manner described below.

Figure 26A:
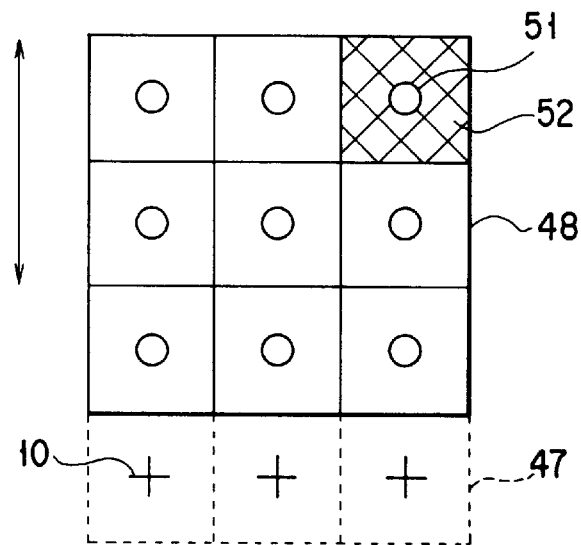
FIGS. 26A and 26B are diagrams showing a method of measuring the positions of reference marks according to the embodiment 3-1.
Figure 26B:
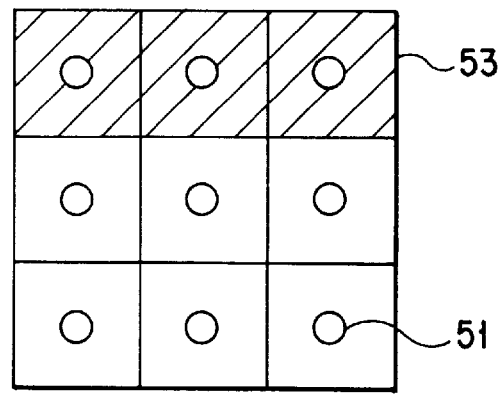

1) First, the mark is moved to about the center of each electron beam optical system thereby to detect a mark position.
2) The mark is moved in Y direction by a distance equivalent to the pitch (10 mm) at which the electron beam optical systems are arranged as shown in FIG. 26A, and the position of the reference mark of each adjacent electron beam optical system is measured. Reference numeral 51 designates an electron gun, and reference numeral 52 a drawing area covered by each electron gun.
3) Then, the stage is moved by −10 mm in the opposite direction to (2) above, and the position of the reference mark of each adjacent electron beam optical system is measured. As a result, the displacement in X and Y directions of a reference mark can be determined for each column. As shown in FIG. 26B, the position of each reference mark along the column was calculated with reference to the electron beam optical systems on the first row designated by 53 in the diagram.
4) The next step is to return the stage to the original position, to move the marks by 10 mm in X direction as in Y direction, and to measure the positions of the reference marks of adjacent electron beam optical systems.
5) As in the case of (3) above, the stage is moved by 10 mm in the opposite direction, and the position of the reference mark of each adjacent electron beam optical system is measured. In the case under consideration, the position of each reference mark along each row was calculated with reference to the electron beam optical systems on the first column.
6) The operation of (1) to (5) above can determine relative positions of the reference marks.
7) The position of the drawing area of each electron beam optical system was calculated in the same manner as in FIG. 25 to offset the relative displacement of the reference marks.
8) The above-mentioned calculation result is converted into the beam deflection data of each electron beam optical system based on the measurement of the beam deflection distortion of each electron beam optical system and stored in the control circuit.

In actual drawing operation, the photomask drawing data are split in advance by the control computer in accordance with the drawing areas of the electron beam optical systems.

When the drawing data are transferred to each electron beam optical system for each main-deflection area, the control circuit moves the stage. At the same time, the correction data for the drawing position stored is added to the drawing data thus sent to carry out the drawing operation. In this way, the stage is moved for each main-deflection area, thereby performing the drawing operation simultaneously in 8×8 electron beam optical systems.

The drawing operation performed in the above-mentioned manner improves the connection accuracy in the drawing area boundary of each electron beam optical system, thereby making possible a high-accuracy drawing. Since the adjustment of the beam deflection distortion and the mark detection of each electron beam optical system can be done for each electron beam optical system separately, the time required for beam adjustment of the multi-beam lithography apparatus is considerably reduced.

Although the above-mentioned embodiments involve an 8×8 array of electron beams, the present invention is not confined to this array size of electron beams. Instead, the invention is applicable with equal effect to an electron beam lithography apparatus having a 100×100 array of electron beams. Also, the invention is not confined to the lithography apparatuses and the drawing methods described above. In addition to the above-mentioned embodiments, the invention is applicable to a lithography apparatus of such a type that each beam is split into a plurality of beams by means of apertures, for example. Further, the invention is not limited to the mark shapes and types described above. Other mark shapes and types than described above to which the invention is applicable include a protruded mark using a heavy metal, for example.

Fourth Embodiment

A fourth embodiment of the invention will be explained. As shown in FIG. 27, each electron beam optical system has a drawing area overlapped with the counterpart of at least one adjacent electron beam optical system. The amount of irradiation is corrected by reducing it to one half for the portion where two drawing areas are overlapped, and to one fourth for the portion where four drawing areas are overlapped. This process can improve the drawing accuracy.

Specific examples of the fourth embodiment will be explained.

Embodiment 4-1

A configuration of a multi-beam lithography apparatus according to this embodiment is schematically shown in FIG. 12. This lithography apparatus has a reference position when each electron beam source is located at the upper left end of each drawing area.

As shown in FIG. 28A, a workpiece 101 is formed with a plurality of beam adjusting marks 103. Each mark has a cross shape as shown in FIG. 28B, and is formed by being dug into a Si substrate by light exposure and plasma etching. The mark has a size of 10 $\mu$m on each side, 1 $\mu$m wide and 2 $\mu$m deep.

The drawable range of this lithography apparatus is 154 mm square, and a total of 9 (=3×3) electron beam sources are arranged at pitches of 50 mm. The beam is deflected in two stages, main and subsidiary. The size of each deflection area is 6 mm for main-deflection, and 2 mm for sub-deflection. The drawing area of each beam is ±27 mm about the charged beam source. The drawing area thus is divided into 81 main-deflection areas for drawing.

According to this embodiment, a photomask of 150 mm square is drawn. Prior to drawing, the mask data are converted in such a manner that a single mask is drawn by a plurality of electron beam sources. Multiple drawings are assumed to be performed for each sub-deflection area. First, the mask data is divided into nine areas at the same pitches that the electron beam sources are arranged. Data as wide as one sub-deflection area is added to the surrounding of the areas to provide a drawing data for one electron beam source as shown in FIG. 29. This data is divided into main-deflection areas, and further into sub-deflection areas, and then converted into bit data. In the diagram, reference numeral 71 designates a mask size, reference numeral 72 designates a drawing area, reference numeral 73 designates a main-deflection area and reference numeral 74 designates a sub-deflection area.

Figure 30:
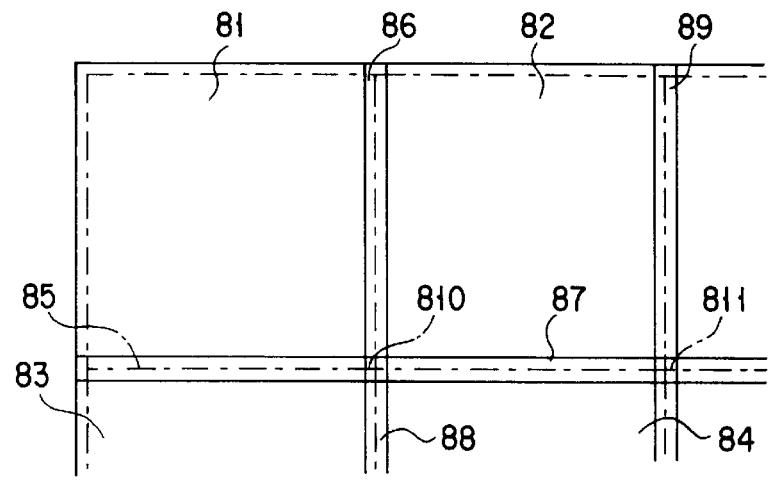
FIG. 30 is a diagram showing the overlapped drawing areas of the electron beam sources.

In data conversion, the areas of double drawing (designated by reference numerals 85, 86, 87, 88, 89) and areas of quadruple drawing (810, 811) apart from the areas drawn with normal exposure amount such as the ones designated by reference numerals 81, 82, 83, 84 in FIG. 30 are provided with data for setting the amount of irradiation. Specifically, the amount of irradiation is corrected in such a manner as to draw the portion having two overlapped areas with one half of the irradiation amount, and the portion having four overlapped areas with one fourth of the irradiation amount. As a result, the area of multiple drawing is irradiated the same amount of light as the area where drawing areas are not overlapped.

Then, the deflection distortion of each charged beam is adjusted in the following-described manner.

Figure 31:
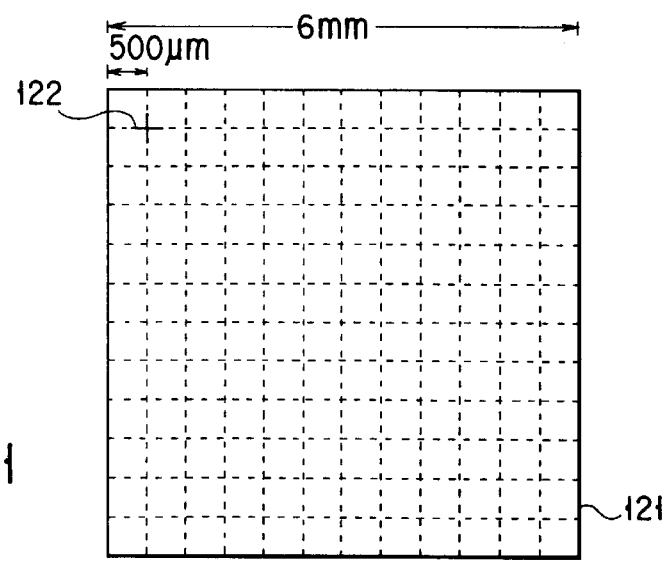
FIG. 31 is a diagram showing the main-deflection area divided at the time of deflection distortion adjustment.

1) As shown in FIG. 31, the main-deflection area of 6 mm square is divided into meshes of 500 $\mu$m, and the stage is moved to set a reference mark on each lattice point. Reference numeral 121 designates a main-deflection area, and reference numeral 122 designates a reference mark.
2) Nine beams are deflected sequentially to detect the mark position.
3) The reference mark is moved and the steps (1) and (2) are repeated.
4) An operation similar to (1) to (3) is performed on the sub-deflection area of 2 mm square with a mesh size of 50 $\mu$m.

Figure 32:
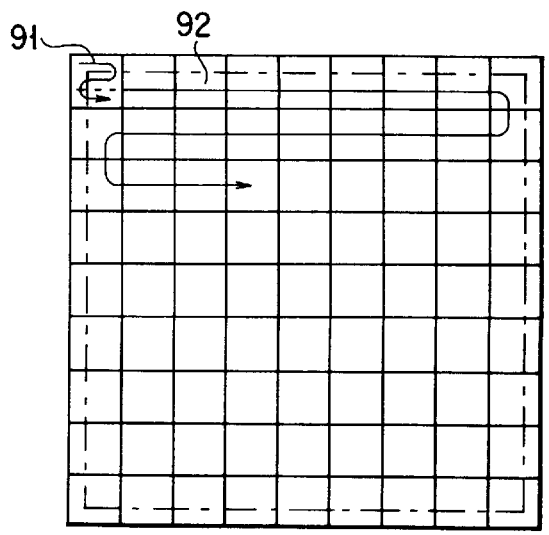
FIG. 32 is a diagram showing the sequence of drawing in the drawing area.

Then, the drawing operation is performed. The stage is moved to a reference position, and the first main-deflection area of each charged beam source is drawn. As shown by reference numeral 91 in FIG. 32, a main-deflection area is drawn, followed by moving the stage rightward by 6 mm. In similar fashion, a second main-deflection area is drawn. The drawing is continued along the line 92 in the diagram.

In the above-mentioned embodiment, a pattern can be formed with a superior connection accuracy even in the deflection boundary areas of the charged beam sources.

The present invention is not limited to the above-mentioned lithography apparatuses and the above-mentioned drawing methods. In addition to the above-mentioned embodiments, the invention is applicable with equal effect to a lithography apparatus of a type with a single beam split into a plurality of beams by apertures. Neither the shape and the type of the mark is limited by the invention. Other shapes and types of the mark to which the invention is applicable include a protruded mark using a heavy metal, for example.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A charged beam lithography apparatus, in which a plurality of charged beams simultaneously irradiate a workpiece, comprising:
   a plurality of charged beam irradiating sources;
   a plurality of charged beam optical systems arranged at positions corresponding to said plurality of charged beam irradiating sources;
   a plurality of collimators arranged at positions corresponding to said plurality of charged beam optical systems, respectively; and
   a plurality of detectors arranged at positions corresponding to said plurality of collimators, respectively, wherein
   charged beams reflected from a plurality of marks have a predetermined angle of incidence with respect to respective of the plurality of detectors.

2. A charged beam lithography apparatus according to claim 1, wherein said plurality of collimators correspond to a plurality of reflected particle detectors of said plurality of charged beam optical systems, respectively.

3. A charged beam lithography apparatus according to claim 1, wherein each of said plurality of collimators is arranged in such a position as to surround the corresponding one of said electron beam optical systems, respectively.

4. A charged beam lithography apparatus according to claim 1, wherein said plurality of collimators each include a shielding plate having an aperture of a predetermined shape.

5. A charged beam lithography apparatus, in which a plurality of charged beams simultaneously irradiate a workpiece, having a plurality of charged beam optical systems, comprising:
   means for selecting one of said plurality of charged beam optical systems as a selected charged beam optical system;

means for detecting marks sequentially in the charged beam optical systems except for the selected charged beam optical system selected by said selection means;

means for measuring an interference of reflected particles from other marks in said selected charged beam optical system;

means for forming groups, each group including a plurality of interference-free charged beam optical systems based on the measurement performed by said measuring means; and means for detecting mark positions at the same time in the charged beam optical systems included in each group formed by said grouping means.

6. A charged beam lithography apparatus, in which a plurality of charged beams simultaneously irradiate a workpiece, comprising:

a plurality of charged beam optical systems;

means for moving a workpiece stage having a plurality of reference marks formed at positions corresponding to said plurality of charged beam optical systems in a first direction and a second direction perpendicular to said first direction;

means for detecting a position of each reference mark with two or more adjacent charged beam optical systems;

means for measuring relative position deviations of said plurality of charged beam optical systems based on position deviations from the reference marks calculated by a detection result of the position of each reference mark; and means for correcting deflections of the plurality of charged beams based on the relative position deviations of said plurality of charged beam optical systems.

7. A charged beam lithography apparatus, in which a plurality of charged beams simultaneously irradiate a workpiece, comprising:

a plurality of charged beam optical systems; and means for drawing in such a manner that adjacent charged beam optical systems overlap at deflection boundary areas of the adjacent charged beam optical systems.

8. A charged beam lithography apparatus according to claim 7, further comprising means for correcting an amount of irradiation in said overlapped areas.

9. A charged beam lithography apparatus according to claim 1, wherein at least two of said plurality of detectors are arranged for each of said plurality of charged beam irradiation sources.

10. A charged beam lithography apparatus according to claim 1, wherein each of said plurality of collimators has a first aperture arranged in a center thereof and at least one second aperture arranged on a periphery thereof.

11. A charged beam lithography apparatus according to claim 10, wherein charged beams that are incident on respective of said plurality of detectors pass through said first aperture and reflected charged beams pass through said at least second aperture.

* * * * *